United States Patent
Hsieh et al.

(10) Patent No.: US 7,295,471 B2
(45) Date of Patent: Nov. 13, 2007

(54) MEMORY DEVICE HAVING A VIRTUAL GROUND ARRAY AND METHODS USING PROGRAM ALGORITHM TO IMPROVE READ MARGIN LOSS

(75) Inventors: Wen-Yi Hsieh, Tainan (TW); Nai-Ping Kuo, Tainan (TW); Chun-Hsiung Hung, Tainan (TW); Ken-Hui Chen, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/273,120

(22) Filed: Nov. 14, 2005

(65) Prior Publication Data

US 2006/0109710 A1 May 25, 2006

Related U.S. Application Data

(60) Provisional application No. 60/627,086, filed on Nov. 12, 2004.

(51) Int. Cl.
*G11C 11/34* (2006.01)
(52) U.S. Cl. .............................. 365/185.16; 365/185.22
(58) Field of Classification Search ........... 365/185.16, 365/185.22
See application file for complete search history.

(56) References Cited

U.S. PATENT DOCUMENTS

| 6,272,043 | B1 | 8/2001 | Hollmer |
| 6,366,519 | B1* | 4/2002 | Hung et al. .................. 365/226 |
| 6,421,267 | B1 | 7/2002 | Kuo et al. |
| 6,529,412 | B1 | 3/2003 | Chen et al. |
| 7,133,316 | B2* | 11/2006 | Lue ........................ 365/185.28 |
| 2003/0044774 | A1* | 3/2003 | Valenzuela et al. ............. 435/5 |
| 2004/0120186 | A1* | 6/2004 | Fasoli et al. .............. 365/185.2 |
| 2004/0246784 | A1* | 12/2004 | Yamada .................. 365/189.07 |
| 2005/0079675 | A1* | 4/2005 | Ilkbahar et al. ............. 438/261 |
| 2005/0270849 | A1* | 12/2005 | Lue ........................ 365/185.28 |
| 2005/0286299 | A1* | 12/2005 | Tomita et al. ......... 365/185.11 |

* cited by examiner

*Primary Examiner*—Michael T Tran
(74) *Attorney, Agent, or Firm*—Akin Gump Strauss Hauer & Feld LLP

(57) ABSTRACT

A program verification method for a memory device having a virtual array including a plurality of memory cells determines if leakage current passes through one or more neighboring memory cells to the programmed memory cell. The programmed memory cell is verified based on a first threshold state if leakage current is determined to pass through one or more neighboring memory cells. The programmed memory cell is verified based on a second threshold state if the leakage current is not determined to pass through one or more neighboring memory cells.

19 Claims, 5 Drawing Sheets

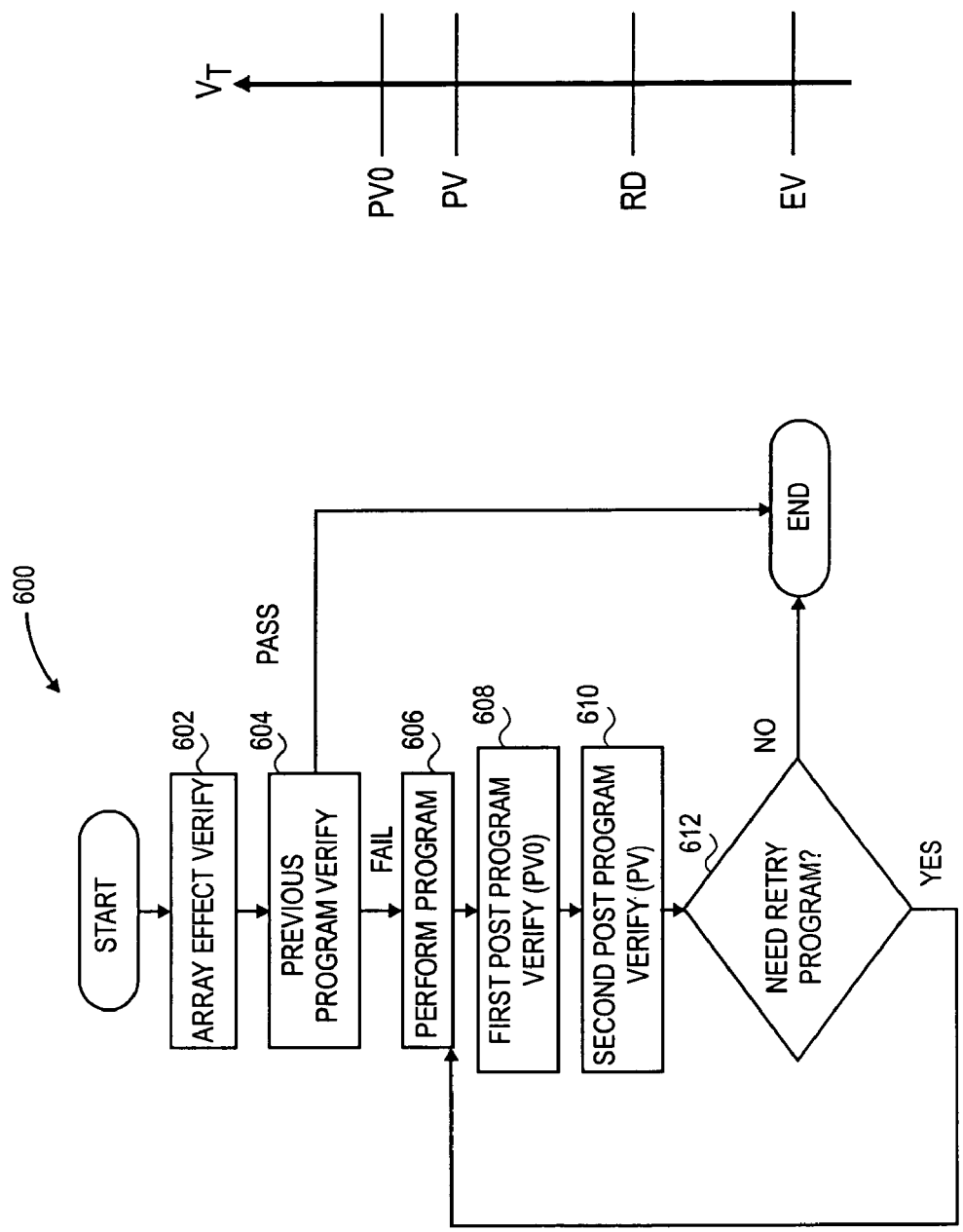

MEMORY DEVICE HAVING A VIRTUAL GROUND ARRAY AND METHODS USING PROGRAM ALGORITHM TO IMPROVE READ MARGIN LOSS

RELATED APPLICATION

This application claims priority to U.S. Provisional Application No. 60/627,086, entitled "MEMORY DEVICE HAVING A VIRTUAL GROUND ARRAY AND METHODS USING PROGRAM ALGORITHM TO IMPROVE READ MARGIN LOSS," filed on Nov. 12, 2004, and hereby incorporated herein by reference.

FIELD

The present invention relates generally to non-volatile memory devices and, more particularly, to a memory device having a virtual ground array and methods using a program algorithm to improve read margin loss.

BACKGROUND

Memory devices, such as Flash memory devices, typically include memory cells of transistors addressable by word lines and bit lines. In a virtual ground array, the common ground line is eliminated and the drain of one memory cell transistor serves as the source of a neighboring memory cell transistor. Data is stored in the transistors of the memory cells. Rows of memory cells can be accessed by word lines and data can be accessed or sensed at the source side or drain side of the transistors by using bit lines. Applying appropriate voltages on the word and bit lines can program or read data to and from the memory cells.

For such a virtual ground array, source side sensing tends to be more accurate and reliable than drain side sensing. In particular, a disadvantage of drain side sensing is that some other bit lines connected to memory cells, which are not selected to read from a memory cell, must be pre-charged to a drain voltage or a higher voltage. This pre-charging of the drain side to the drain voltage or higher voltage can cause slower read speed and higher power consumption.

Source side sensing also has some disadvantages. For instance, during a read operation, the sensing amplifier sensing the memory cell current at the source side must determine a logic level "1" or "0," but leakage current can occur at the source side as a result of shared charging between neighboring memory cells. This can cause read sensing error and induce read margin loss as a result of the memory cell current being less than normal due to leakage, which is commonly referred to as an "array effect." Consequently, after data is programmed in a memory cell and during a program verify operation (process of determining that correct data is programmed in the memory cell), the array effect can cause a programmed memory cell to pass verification but still have an insufficient threshold voltage to allow the cell to be read correctly.

As a result, this can induce an insufficient high threshold voltage (HVT) programmed state and cause read margin loss, i.e., the proper data not being programmed or read from a memory cell. The HVT induced margin loss can cause a widening HVT distribution, especially after numerous program cycles. Furthermore, in the case of widening HVT distribution, an "over erase" state can occur and exacerbate the array effect. Therefore, after numerous program-erase cycles, the array effect and HVT margin loss, as well as the widening of the HVT distribution, can become a serious problem in memory devices using a virtual ground array.

Thus, there is a need for improved memory devices and methods that can minimize read margin loss in a virtual ground array and tighten HVT distribution to improve data reliability and retention.

SUMMARY

According to one aspect of the invention, in a memory device having a virtual array including a plurality of memory cells, a method is disclosed. A memory cell is programmed. Leakage current is determined if it passes through one or more neighboring memory cells to the programmed memory cell. A first verification is performed for the programmed memory cell based on a first threshold state if leakage current is determined to pass through one or more neighboring memory cells. A second verification is performed for the programmed memory cell based on a second threshold state if no leakage current is determined to pass through one or more neighboring memory cells.

According to another aspect of the invention, a memory device is disclosed. The memory device includes a virtual ground array having a plurality of memory cells, each memory cell including at least one data bit. The memory device also includes circuitry configured to program a memory cell, determine if leakage current passes through one or more neighboring memory cells to the programmed memory cell, perform a first verification for the programmed memory cell based on a first threshold state if leakage current is determined to pass through one or more neighboring memory cells, and perform a second verification for the programmed memory cell based on a second threshold state if no leakage current is determined to pass through one or more neighboring memory cells.

According to another aspect of the invention, a method for verifying a programmed memory cell is disclosed. A determination is made if adjacent memory cells to the programmed memory cell are at a low voltage threshold state. If the adjacent memory cells are at the low voltage threshold state, a determination is made if the threshold voltage of the programmed memory cell is at a desired level by checking if the programmed memory cell has leakage current or no leakage current.

According to another aspect of the invention, in a memory device having a virtual array including a plurality of memory cells, a method is disclosed for programming a memory cell; determining if neighboring memory cells to the programmed memory cell are at a low voltage threshold state; performing a first verification for the programmed memory cell based on a first threshold state if one or more neighboring memory cells are at a low threshold voltage state; and performing a second verification for the programmed memory cell based on a second threshold state if one or more neighboring memory cells are at a low threshold voltage state.

According to another aspect of the invention, a memory device is disclosed having a plurality of word lines and bit lines and a plurality of memory cells connected by the word lines and bit lines. The memory device also includes at least one sense amplifier connected to one of the bit lines and receiving a current from a programmed memory cell that accounts for an array effect in the memory device.

BRIEF DESCRIPTION OF THE DRAWINGS

The accompanying drawings, which are incorporated in and constitute part of this specification, illustrate examples and exemplary embodiments of the invention, and together with the description, serve to explain the principles of the invention. In the drawings.

FIG. 6A illustrates an exemplary program verify operation for memory cells in a virtual ground array that accounts for the array effect; and FIG. 6B illustrates an exemplary voltage thresholds graph relating to the exemplary operation described in FIG. 6A.

DETAILED DESCRIPTION

Reference will now be made in detail to the exemplary embodiments of the invention, examples of which are illustrated in the accompanying drawings. Wherever possible, the same reference numbers will be used throughout the drawings to refer to the same. The following examples and methods disclose techniques for minimizing read margin loss and improving data reliability and retention in a virtual ground array.

According to one example, in a memory device having a virtual array including a plurality of memory cells, a method is disclosed that programs a memory cell. A determination is made if leakage current passes through one or more neighboring memory cells to the programmed memory cell. The programmed memory cell is then verified based on a first voltage level (e.g., a higher high voltage threshold HVT level) if leakage current is determined to pass through one or more neighboring memory cells. Otherwise, the programmed memory cell is verified based on a second voltage level (e.g., a lower high voltage threshold HVT level). As a result, the effect of neighboring cell leakage may be accounted for. That is, by determining if leakage current passes through neighboring memory cells, the array effect can be associated with the programmed memory cell. If array effect is associated with the programmed memory cell, the programmed memory cell can be verified based on an appropriate higher HVT level. And the cell can then be reprogrammed if it doesn't meet that level, thereby allowing proper data be stored in the memory cell and then correctly read out. In other words, the process may reduce read data margin loss in view of the array effect. The following description details exemplary embodiments.

Figures 1, 2:
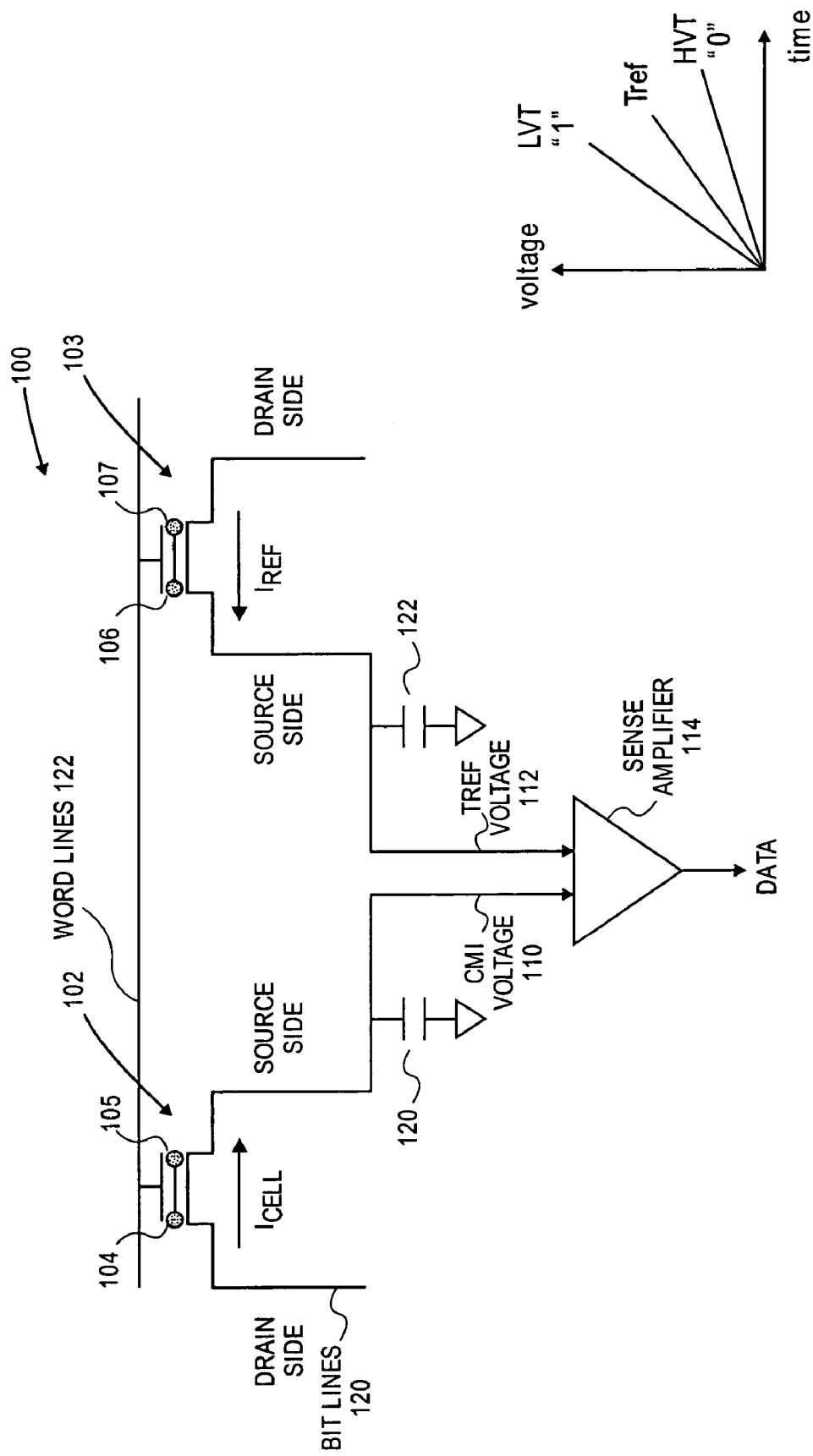
FIG. 1 illustrates an exemplary memory device using a source sensing scheme.
FIG. 2 illustrates one exemplary voltage versus time graph in determining logic states of a data bit in a memory cell.

FIG. 1 illustrates an exemplary memory device using a source sensing scheme. As shown, each memory cell includes a drain side and a source side. In this example, source side sensing is shown where the source side of memory cell 102 and reference cell 103 are connected and feed into a sensing amplifier 114 for performing a source side sensing read operation. The memory cell 102 includes a transistor that can store two bits of data, (104, 105).

As an example, a data read operation of the data stored in data bit 105 of memory cell 102, a cell current flows from the drain side to the source side. In this example, memory cell current from the source side of memory cell 102 is converted by a current-to-voltage converter 120 into a current sensing voltage (CMI) 110. The current passing through reference cell 103 to the source side is converted by a current-to-voltage converter 122 into a reference voltage (TREF) 112. Both the CMI and TREF voltages 110 and 112 feed into the sensing amplifier 114. The sensing amplifier 114 compares the CMI voltage 110 with the TREF voltage 112 to determine if a high voltage threshold (HVT) logic "0" or a low voltage threshold (LVT) logic "1" is stored in data bit 105. In some other examples, other reference voltages can be used and compared with the CMI voltage 110.

FIG. 2 illustrates one exemplary voltage versus time graph in determining logic states of a data bit for a memory cell. As shown, if the sensing amplifier 114 senses that the CMI voltage 110 is less than the TREF voltage 112, the sensing amplifier 114 senses a HVT condition for data bit 105 and passes data as a logic "0." Likewise, if the sensing amplifier 114 senses that the CMI voltage 110 is greater than the TREF voltage 112, the sensing amplifier 114 senses a LVT condition for data bit 105 and passes data as a logic "1." However, during a read or verify operation, the memory cell current $I_{CELL}$ may experience leakage due to charging between memory cells that generates a leakage current $I_{AE}$, an "Array Effect" current that will be further illustrated below. As a result of this array effect, the current received by the sensing amplifier $I_{SA}$ is less than what it should be. For example, the current received by the sensing amplifier can be determined by the following equation:

$$I_{SA} = I_{CELL} - I_{AE}.$$

In other words, referring to FIG. 1, the sensing amplifier 114 may not receive the proper CMI voltage 110 in comparing with the TREF voltage 112. In such instances, an improper comparison may be determined and incorrect logic determination made.

Figure 3:
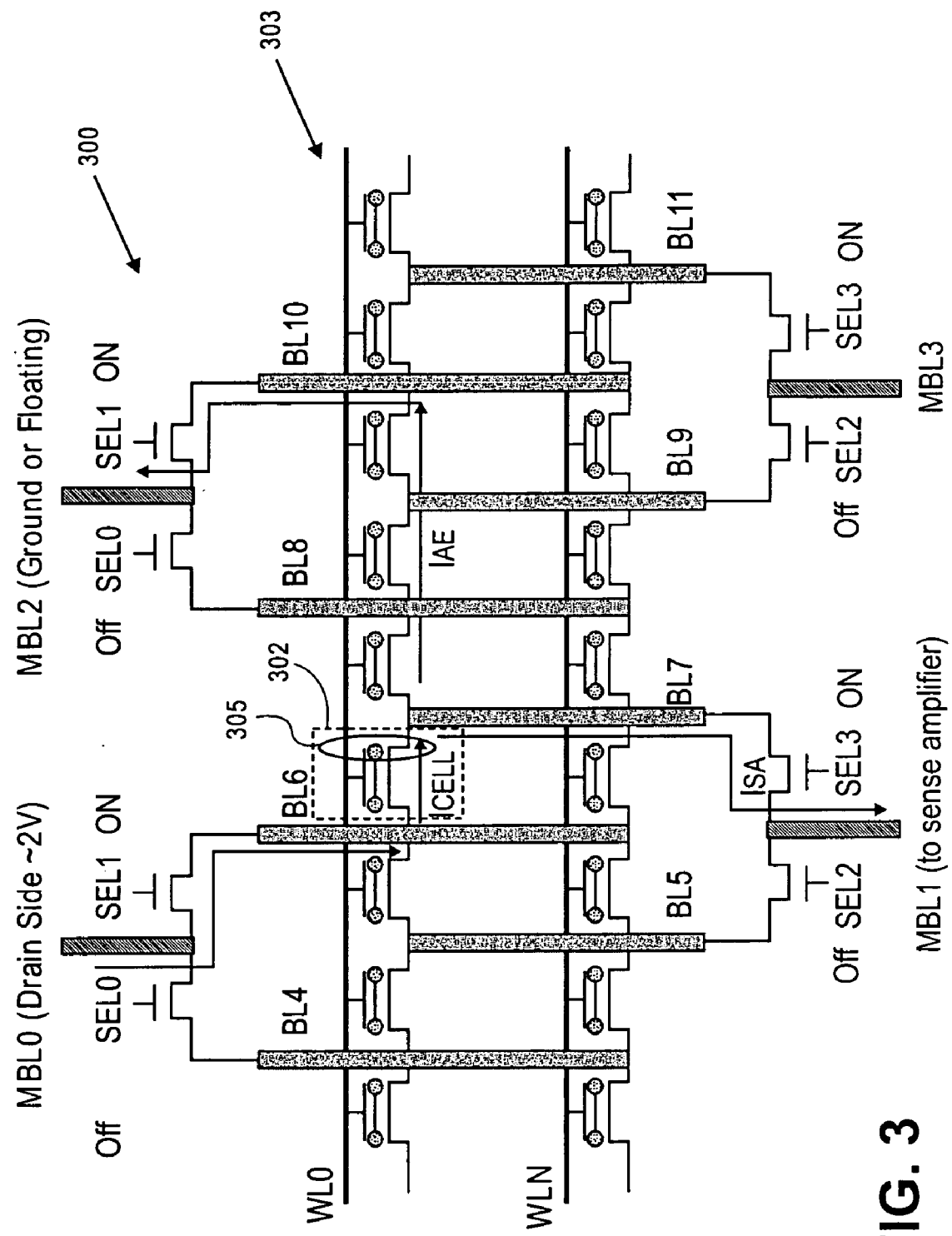
FIG. 3 illustrates another exemplary schematic diagram of a virtual ground array for a memory device.

FIG. 3 illustrates one exemplary schematic diagram of a virtual ground array 303 for a memory device 300. As shown, a plurality of memory cells are located at the intersection of bit lines BL4 through BL11 and word lines WL0 to WLN. The bit lines are connected to select transistors SEL0 to SEL3, which are connected to main bit lines MBL0 through MBL1. In this example, MBL0 is set at 2V, MBL2 is at ground or floating, MBL1 provides the ISA current to a sensing amplifier, and MBL3 is at ground or floating.

For the memory cell 305, connected to word line WL0 and located between bit lines BL6 and BL7, the memory cell current $I_{CELL}$ flows through the memory cell 305 during a read or program verify operation. Leakage can occur to generate leakage current $I_{AE}$ that can flow through adjacent memory cells, if these adjacent memory cells at LVT state (erased state). The current received by the sensing amplifier $I_{SA}$, e.g., sensing amplifier 114 in FIG. 1, through the select transistor SEL3, passes from the source side of memory cell 305 through bit line BL7. The $I_{SA}$ represents the data bit 302 stored in the transistor of memory cell 305. As illustrated, based on the above equation, the leakage current $I_{AE}$ cab cause the sensing amplifier $I_{SA}$ current to be less than the desired memory cell $I_{CELL}$ current, i.e., the $I_{SA}$ current does not correctly reflect memory cell current $I_{CELL}$.

Figure 4:
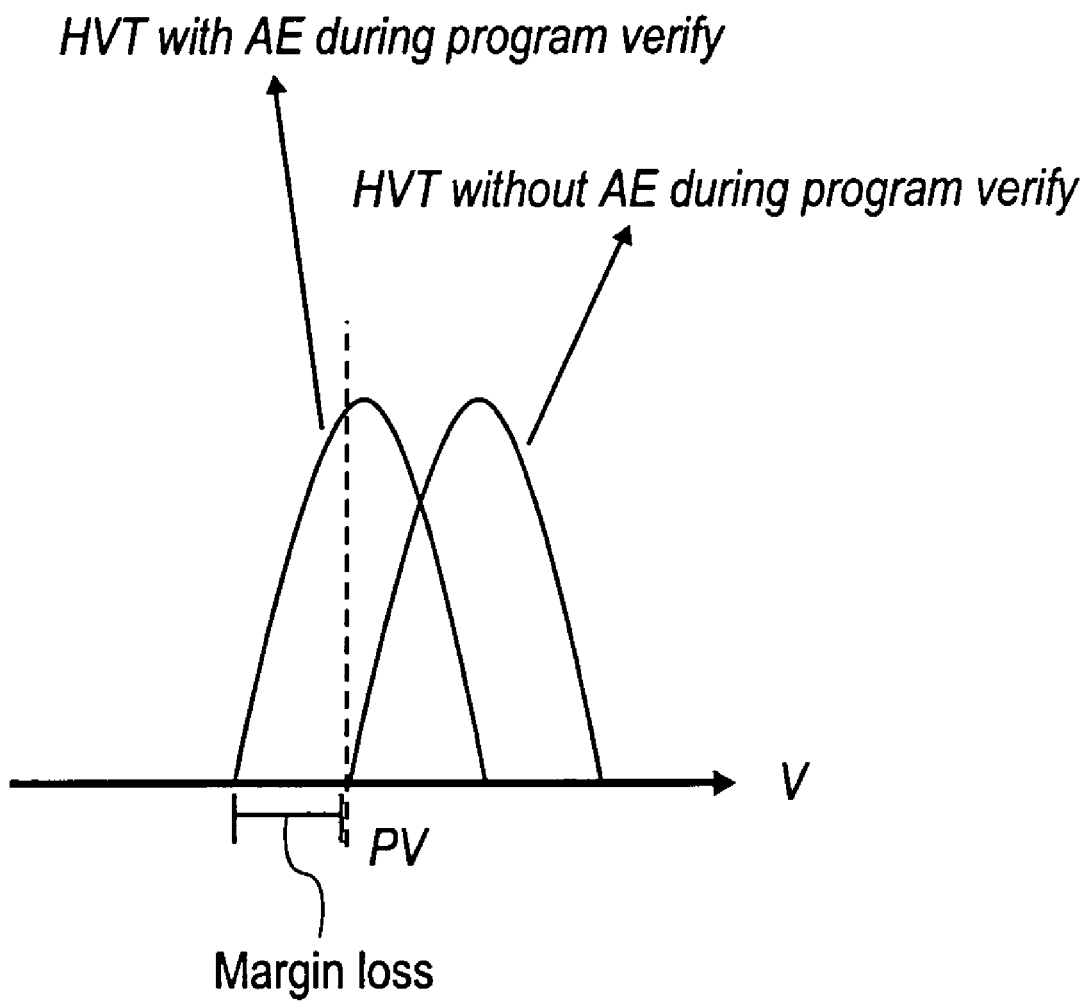
FIG. 4 illustrates an exemplary graph showing HVT distributions with and without array effect during a program verify operation.

Thus, the memory device 300 may exhibit HVT margin loss as a result of the array effect. FIG. 4 illustrates an exemplary graph showing HVT distribution with and without array effect during a program verify operation. In comparing the HVT distributions, the HVT distribution with array effect shifts to the left, producing a margin loss as shown. As a result, the sensing amplifier, when receiving its voltage, may not properly sense and determine if correct data has been programmed or read from a programmed memory cell, thereby deteriorating data reliability and retention during a program verify operation.

Figures 5A, 5B:
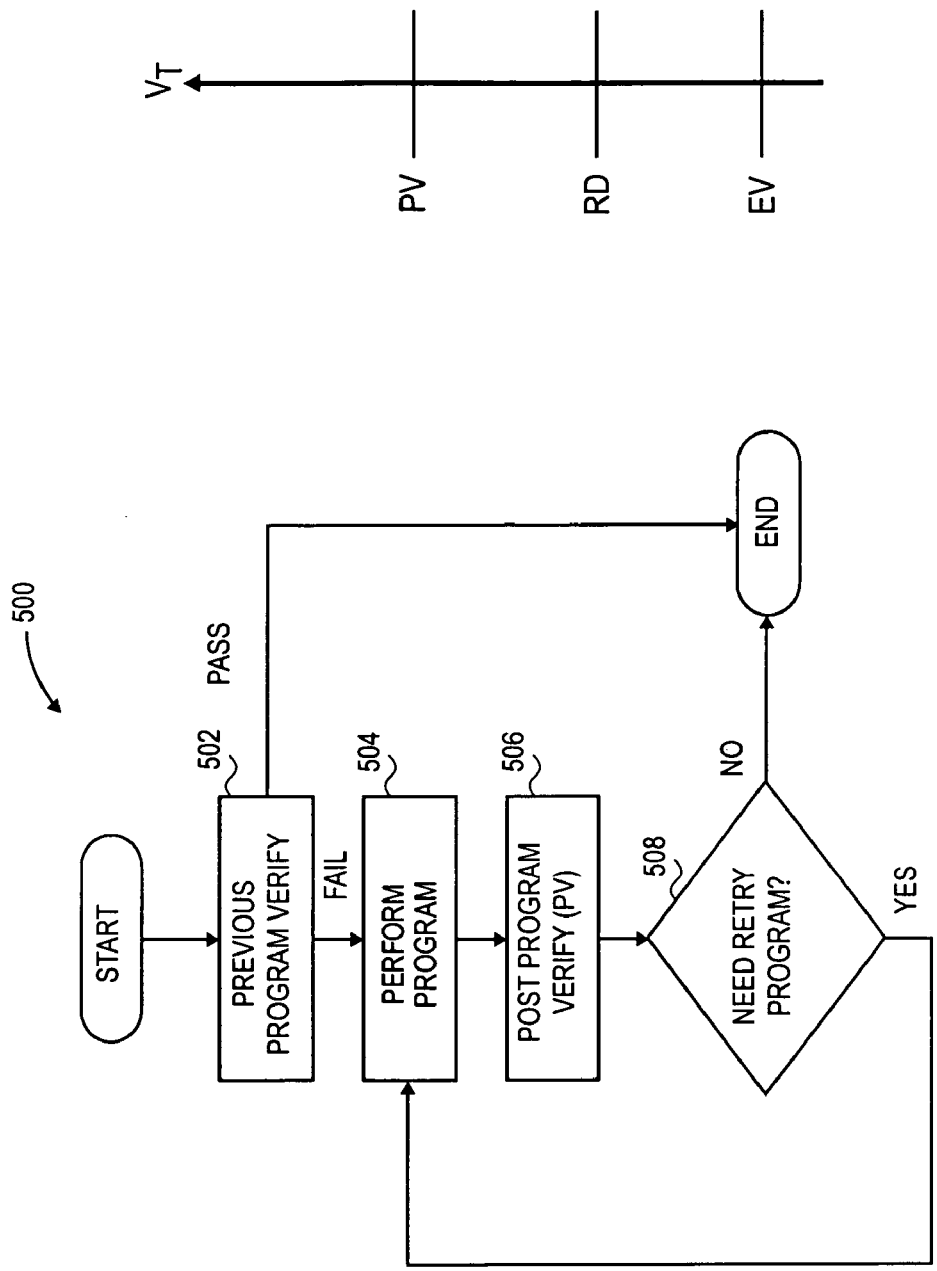
FIG. 5A illustrates a prior art program verify operation for memory cells in a virtual ground array.
FIG. 5B illustrates voltage thresholds graph relative to a program verification, read operation, and array effect relating to the prior art operation of FIG. 5A.

FIG. 5A illustrates a prior art program verify operation 500 for memory cells in a virtual ground array. Initially, if the array or cell passes a previous program verification for verifying the previously programmed result, the operation ends (step 502). If it fails, a program operation is performed (step 504). A post program verification (PV) is performed (step 506). Based on the verification, a program retry determination is made (step 506). If a program retry is required, operation 500 continues to step 504. If it does not, operation 500 ends. Such a prior operation for the above examples does not identify if the array effect exists and therefore cannot accommodate for it.

For instance, if the source side adjacent cells of a memory cell being verified is in a low threshold LVT state, then the leakage current flowing through the adjacent cells causes the sensing amplifier to receive a sensing amplifier current $I_{SA}$ that is less than the verified memory cell current $I_{CELL}$. However, in this LVT case, a programmed memory cell can still pass the program verification, but may not have enough threshold voltage, as illustrated in FIG. 5B that shows WL voltage level relative to the program verify (PV) operation, normal read operation (RD), and erase verify (EV)operation. That is, the PV level is the margin distribution low bound for HVT (programmed) state, the EV level is the margin distribution high bound for LVT (erased) state. Consequently, for adjacent memory cells that need programming for subsequent program operations, the leakage current will be eliminated and margin loss will occur. Otherwise, if the leakage current is eliminated, the HVT distribution will widen (as shown in FIG. 4) and cause an over erase problem and widen the LVT for the memory cells. After continuous program and erase operation, the above problems become more serious affecting charge loss and reliability of the virtual ground array.

The exemplary program verify techniques described in FIGS. 6A and 6B perform verification using two different voltage levels to account for the HVT distribution shift (e.g., shown in FIG. 4) as a result of the array effect and if no array effect exists.

FIG. 6A illustrates an exemplary program verify operation 600 for memory cells in a virtual ground array that accounts for the array effect. Initially, a check is made if the adjacent memory cells to a programmed cell ready for verification are all at an LVT state logic "1" before a previous program verification check is performed (step 602)—referred to as "array effect verify"—i.e., the logic state 1 indicates the array effect. This result is recorded. Next, a previous program verification is performed (step 604) for verifying the previously programmed result. If the memory array or cell passes the verification, operation 600 ends. If it fails, a program or reprogram operation is performed (step 606). Next, a first post program verification (PV0) is performed (step 608). This first verification determines if the threshold voltage of the programmed memory cell is at a high enough state (step 608). A memory cell that exhibits leakage current can pass the first verification if the adjacent memory cells are at the LVT or logic "1" state (i.e., exhibiting array effect). If there is no leakage current, a second verification is performed that determines if the programmed memory is at a high enough state for no array effect. Thus, for a program cell not affected by the array effect, it only needs to pass the second verification step. These operations regarding WL voltage level of such a unique operation are illustrated in FIG. 6B.

For programmed memory cells experiencing array effect due to leakage current passing through adjacent memory cells, the first post program verify will identify such memory cells as having a high HVT and must be at a PV0 level. This check can reduce the HVT margin loss of an array effect during program verify operations. As a result, the HVT distribution can be narrowed. Therefore, improving the read margins provides better cycle characteristics, less charge loss, and better data retention and reliability.

Thus, memory device having a virtual ground array and methods using a program algorithm to improve read margin loss have been described. The memory device described herein can also include any combination of circuitry and/or software or programmable logic to implement the program steps described herein. For example, the memory device can contain appropriate circuitry to determine if neighboring cells have leakage current or to perform program verification based on any voltage threshold level. Thus, in the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. In a memory device having a virtual array including a plurality of memory cells, a method comprising:
   programming a memory cell;
   determining if leakage current passes through one or more neighboring memory cells to the programmed memory cell;
   performing a first verification for the programmed memory cell based on a first threshold state if leakage current is determined to pass through one or more neighboring memory cells; and
   performing a second verification for the programmed memory cell based on a second threshold state if no leakage current is determined to pass through one or more neighboring memory cells.

2. The method of claim 1, wherein the step of determining includes determining an array effect for the neighboring memory cells.

3. The method of claim 2, wherein the first threshold state is a high voltage threshold state and the second threshold state is a low voltage threshold state.

4. The method of claim 3, wherein the high voltage threshold state is associated with the array effect.

5. The method of claim 1, further comprising:
   reprogramming the memory cell if the first or second verification fails.

6. A memory device comprising:
   a virtual ground array including a plurality of memory cells, each memory cell including at least one data bit; and
   circuitry configured to program a memory cell, determine if leakage current passes through one or more neighboring memory cells to the programmed memory cell, perform a first verification for the programmed memory cell based on a first threshold state if leakage current is determined to pass through one or more neighboring memory cells, and perform a second verification for the programmed memory cell based on a second threshold state if no leakage current is determined to pass through one or more neighboring memory cells.

7. The memory device of claim 6, wherein the circuitry is further configured to determine an array effect for the neighboring memory cells.

8. The memory device of claim 7, wherein the first threshold state is a high voltage threshold state and the second threshold state is a low voltage threshold state.

9. The memory device of claim 8, wherein the high voltage threshold state is associated with the array effect.

10. The memory device of claim 6, wherein the circuitry is further configured to reprogram the memory cell if the first or second verification fails.

11. A method for verifying a programmed memory cell, the method comprising:
   determining if adjacent memory cells to the programmed memory cell are at a low voltage threshold state; and
   if the adjacent memory cells are at the low voltage threshold state, determining if the threshold voltage of the programmed memory cell is at a desired level by checking if the programmed memory cell has leakage current or no leakage current.

12. In a memory device having a virtual array including a plurality of memory cells, a method comprising:
   programming a memory cell;
   determining if neighboring memory cells to the programmed memory cell are at a low threshold voltage state;
   performing a first verification for the programmed memory cell based on a first threshold state if one or more neighboring memory cells are at a low threshold voltage state; and
   performing a second verification for the programmed memory cell based on a second threshold state if one or more neighboring memory cells are at a high threshold voltage state.

13. The method of claim 12, wherein the step of determining includes determining an array effect for the neighboring memory cells.

14. The method of claim 13, wherein the first threshold state is a high voltage threshold state and the second threshold state is a low voltage threshold state.

15. The method of claim 14, wherein the high voltage threshold state is associated with the array effect.

16. The method of claim 12, further comprising:
   reprogramming the memory cell if the first or second verification fails.

17. A memory device comprising:
   a plurality of word lines and bit lines;
   a plurality of memory cells connected by the word lines and bit lines;
   at least one sense amplifier connected to one of the bit lines and receiving a current from a programmed memory cell that accounts for an array effect in the memory device, wherein said memory device includes circuitry configured to perform a first verification of the programmed memory cell based on a high voltage threshold and a second verification of the programmed memory cell based on a low voltage threshold.

18. The memory device of claim 17, wherein the at least one sense amplifier receives the current from the programmed memory cell that accounts for leakage current in one or more neighboring memory cells to the programmed memory cell.

19. The memory device of claim 18, further comprising:
   circuitry configured to determine if the array effect is accounted for in the memory device.

* * * * *